(12) United States Patent
Nitta

(10) Patent No.: US 9,286,992 B2
(45) Date of Patent: Mar. 15, 2016

(54) REFRESH APPARATUS AND ELECTRONIC DEVICE THAT ENSURE SIMPLIFIED REFRESH PROCESS OF FLASH MEMORY

(71) Applicant: Kyocera Document Solutions Inc., Osaka (JP)

(72) Inventor: Kenichiro Nitta, Osaka (JP)

(73) Assignee: Kyocera Document Solutions Inc., Osaka (JP)

(*) Notice: Subject to any disclaimer, the term of this patent is extended or adjusted under 35 U.S.C. 154(b) by 0 days.

(21) Appl. No.: 14/571,317

(22) Filed: Dec. 16, 2014

(65) Prior Publication Data

US 2015/0170753 A1 Jun. 18, 2015

(30) Foreign Application Priority Data

Dec. 17, 2013 (JP) ................................. 2013-259780

(51) Int. Cl.
*G11C 16/04* (2006.01)
*G11C 16/34* (2006.01)
*G11C 16/26* (2006.01)
*G11C 16/30* (2006.01)
*G11C 16/16* (2006.01)

(52) U.S. Cl.
CPC ............ *G11C 16/3418* (2013.01); *G11C 16/16* (2013.01); *G11C 16/26* (2013.01); *G11C 16/30* (2013.01)

(58) Field of Classification Search
CPC ............ G06F 11/1451; G06F 11/1464; G06F 12/0811; G06F 1/3287; G06F 11/406; G06F 11/40611; G06F 16/10; G06F 16/105; G06F 16/26; G06F 7/1075; G06F 8/12
See application file for complete search history.

(56) References Cited

U.S. PATENT DOCUMENTS

| | | | | |
|---|---|---|---|---|
| 2003/0214871 | A1* | 11/2003 | Mizuno | 365/222 |
| 2007/0030747 | A1* | 2/2007 | Hirai et al. | 365/222 |
| 2008/0104310 | A1* | 5/2008 | Stern et al. | 711/103 |
| 2011/0153928 | A1* | 6/2011 | Avudaiyappan et al. | 711/109 |
| 2012/0008394 | A1* | 1/2012 | Lee et al. | 365/185.11 |
| 2012/0278533 | A1* | 11/2012 | Suzuki et al. | 711/103 |

FOREIGN PATENT DOCUMENTS

JP  2010-015477 A  1/2010

* cited by examiner

*Primary Examiner* — Tuan T. Nguyen
*Assistant Examiner* — Uyen B Tran
(74) *Attorney, Agent, or Firm* — James W. Judge

(57) ABSTRACT

A refresh apparatus includes a flash memory and a refreshing unit. The flash memory includes a plurality of blocks, the plurality of blocks storing data. The refreshing unit sequentially refreshes the plurality of blocks in units of blocks. The refreshing unit includes a reading unit, a data deleting unit, and a data writing unit. The reading unit performs batch reading of data from the plurality of blocks. The data deleting unit deletes data stored in a target block for the refresh during the refresh in units of blocks. The data writing unit writes data corresponding to the deleted data among the plurality of read data to the target block so as to complete the refresh in units of blocks.

7 Claims, 4 Drawing Sheets

REFRESH APPARATUS AND ELECTRONIC DEVICE THAT ENSURE SIMPLIFIED REFRESH PROCESS OF FLASH MEMORY

INCORPORATION BY REFERENCE

This application is based upon, and claims the benefit of priority from, corresponding Japanese Patent Application No. 2013-259780 filed in the Japan Patent Office on Dec. 17, 2013, the entire contents of which are incorporated herein by reference.

BACKGROUND

Unless otherwise indicated herein, the description in this section is not prior art to the claims in this application and is not admitted to be prior art by inclusion in this section.

Repeated reading of data by a specified number of times from a NAND flash memory or a similar memory causes an error of incorrect reading of data, a so-called read disturb.

In view of this, there is a known method in which a flash memory is refreshed at an every specified timing, for example.

This method refreshes (re-writes) any given number of target blocks among a plurality of blocks constituting the flash memory. Specifically, data is read to a buffer in units of target blocks. Then, the read data are written to another block again.

Accordingly, this method can sequentially refresh the any given number of target blocks in units of blocks.

However, the technique writes the data in the target block to another block again. Therefore, a logic block needs to be made correspond to a physical block or a similar operation is required. As a result, a refresh process is complicated.

SUMMARY

A refresh apparatus according to one aspect of the disclosure includes a flash memory and a refreshing unit. The flash memory includes a plurality of blocks, the plurality of blocks storing data. The refreshing unit sequentially refreshes the plurality of blocks in units of blocks. The refreshing unit includes a reading unit, a data deleting unit, and a data writing unit. The reading unit performs batch reading of data from the plurality of blocks. The data deleting unit deletes data stored in a target block for the refresh during the refresh in units of blocks. The data writing unit writes data corresponding to the deleted data among the plurality of read data to the target block so as to complete the refresh in units of blocks.

These as well as other aspects, advantages, and alternatives will become apparent to those of ordinary skill in the art by reading the following detailed description with reference where appropriate to the accompanying drawings. Further, it should be understood that the description provided in this summary section and elsewhere in this document is intended to illustrate the claimed subject matter by way of example and not by way of limitation.

DETAILED DESCRIPTION

Figure 1:
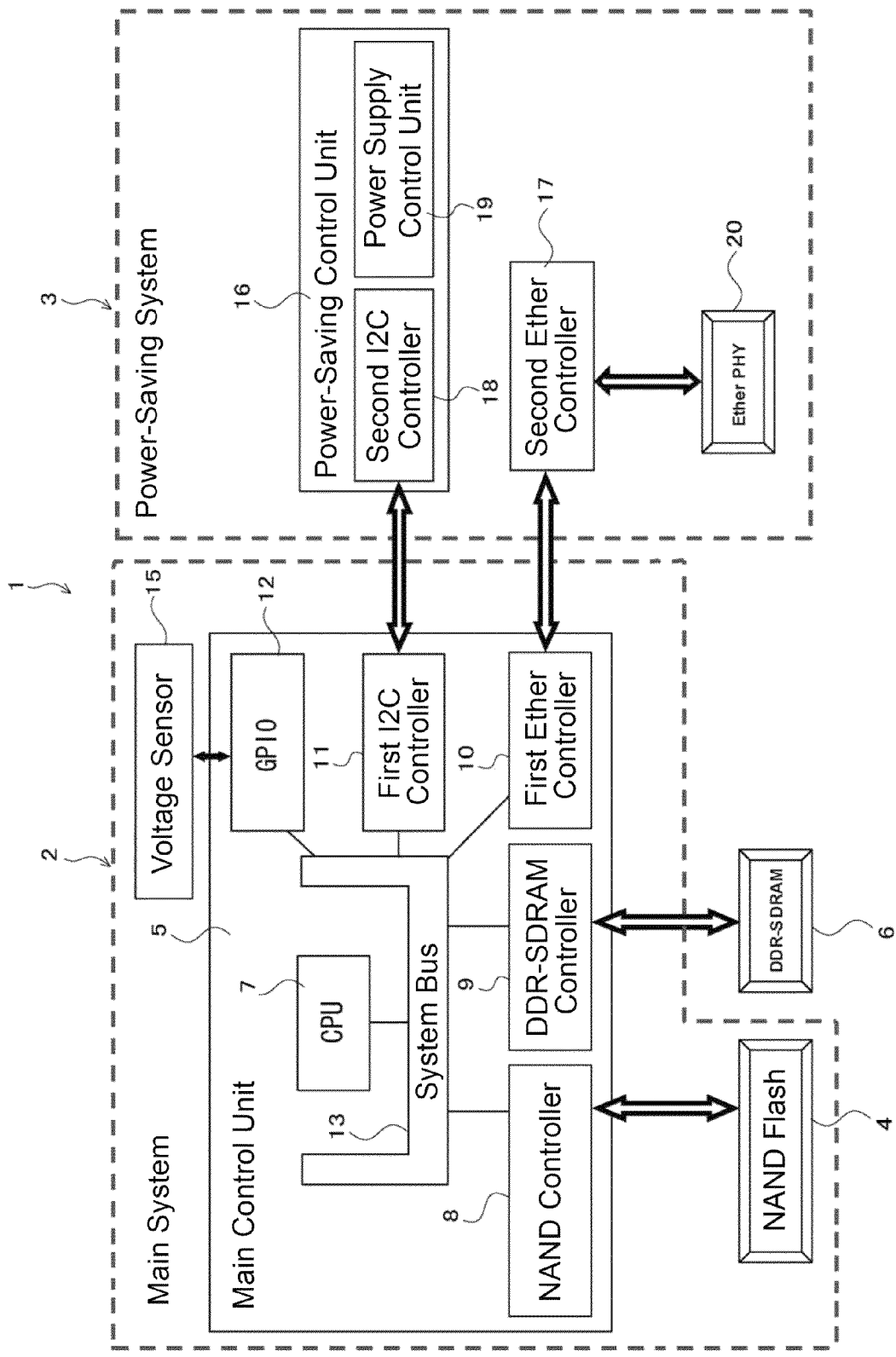
FIG. 1 illustrates a schematic diagram of a block configuration of an image forming apparatus with a refresh apparatus according to one embodiment of the disclosure.

Example apparatuses are described herein. Other example embodiments or features may further be utilized, and other changes may be made, without departing from the spirit or scope of the subject matter presented herein. In the following detailed description, reference is made to the accompanying drawings, which form a part thereof.

The example embodiments described herein are not meant to be limiting. It will be readily understood that the aspects of the present disclosure, as generally described herein, and illustrated in the drawings, can be arranged, substituted, combined, separated, and designed in a wide variety of different configurations, all of which are explicitly contemplated herein.

An object of simplifying a refresh process of a flash memory is achieved by the following refresh apparatus. The refresh apparatus performs batch reading data from a plurality of blocks in the flash memory. During the refresh in units of blocks, the refresh apparatus deletes data stored in a refresh target block. The refresh apparatus writes the data corresponding to the deleted data in the plurality of read data to the target block.

The refresh apparatus is preferable to have the following function. The refresh apparatus checks whether a power supply shut off that disables refresh in units of blocks is occurring or not before the start of refresh in units of blocks. If the power supply shut off is occurring, the refresh apparatus halts the refresh in units of blocks.

A plurality of pieces of data stored in the plurality of blocks, for example, can be a plurality of pieces of data constituting one single item of data. The one single item of data is, for example, an initiation program such as a boot loader or a similar program. The main system, which stops while an electronic device is in a power-saving mode, reads the boot loader during the start of the main system.

The following describes one embodiment according to the disclosure with reference to the drawings.

Image Forming Apparatus

FIG. 1 is a schematic diagram of a block configuration of an image forming apparatus 1 with a refresh apparatus according to one embodiment of the disclosure. The refresh apparatus 14 of this embodiment is applied to the image forming apparatus 1 as an electronic device. The image forming apparatus 1 is formed of a digital multi-functional peripheral having a power-saving mode. The image forming apparatus 1 includes a main system 2 and a power-saving system 3.

The main system 2 mainly performs an apparatus control such as a system control and an image processing control of the image forming apparatus 1. The main system 2 is stopped during the power-saving mode and during recovery from the power-saving mode, the main system 2 is started by the power-saving system 3. This main system 2 includes a NAND flash 4 and a main control unit 5.

The NAND flash 4 is a NAND flash memory. The NAND flash 4 stores a program for operation control including a boot loader or a similar program. The NAND flash 4 of this embodiment is refreshed when the number of readings of a storage region of the boot loader becomes equal to or more than the specified number of times. The details will be described later.

The NAND flash 4 constitutes the main storage device together with a Double-Data-Rate Synchronous Dynamic Random Access Memory (DDR-SDRAM) 6. The DDR-SDRAM 6 is a memory that temporarily stores a program and various data and is employed as a work area or a similar area.

The main control unit 5 is, for example, constituted as a System-on-a-chip (SoC). The main control unit 5 includes a Central Processing Unit (CPU) 7, a NAND controller 8, a DDR-SDRAM controller 9, a first Ether controller 10, a first I2C controller 11, a General Purpose Input/Output (GPIO) 12, or a similar unit are mounted on the same semiconductor chip. The respective units are connected with a system bus 13.

The CPU 7 is an arithmetic device that controls the respective units in the image forming apparatus 1 by running the program inside of the NAND flash 4. The CPU 7 constitutes the refresh apparatus 14 (see FIG. 2) together with the NAND flash 4. The refresh apparatus 14 will be described later.

The NAND controller 8 is a local bus controller that transmits and receives data to/from the NAND flash 4.

The DDR-SDRAM controller 9 is a memory controller that transmits and receives data to/from the DDR-SDRAM 6.

The first Ether controller 10 transmits and receives data to/from an external device via a network such as LAN.

The first 120 controller 11 provides a communications link with the power-saving system 3. The first 120 controller 11 ensures inputting a transition signal for transition to the power-saving mode and a start signal in the power-saving mode from the power-saving system 3 to the main system 2.

The GPIO 12 constitutes an interface for notification. The GPIO 12 receives a signal from a voltage sensor 15. The voltage sensor 15 detects a voltage changed by shutting off a main power supply of the image forming apparatus 1 or a similar cause. The voltage sensor 15 inputs the detection signal of the voltage to the GPIO 12.

The power-saving system 3 controls the power-saving mode. The power-saving system 3 stops the main system 2 and sets the power-saving mode. Alternatively, the power-saving system 3 recovers (starts) the main system 2 from the power-saving mode according to a specified trigger. The power-saving system 3 includes a power-saving control unit 16 and a second Ether controller 17.

The power-saving control unit 16 includes a second 120 controller 18 and a power supply control unit 19. The second 120 controller 18 provides a communications link with the main system 2. The second 120 controller 18 ensures outputting the transition signal for transition to the power-saving mode and a start signal for recovery from the power-saving mode to the main system 2. The power supply control unit 19 controls the transition to the power-saving mode on the main system 2 and the power supply for recovery from the power-saving mode.

The second Ether controller 17 transmits and receives data to/from the external device over a network such as the LAN, via an Ether PHY 20, which is a physical connection unit. The second Ether controller 17 performs an alternative response instead of the main system 2 to a specified input in the power-saving mode. During the normal mode (non-power-saving mode), data can be transmitted and received by the first Ether controller 10 in the main system 2 via the second Ether controller 17

Refresh Apparatus

Figure 2:
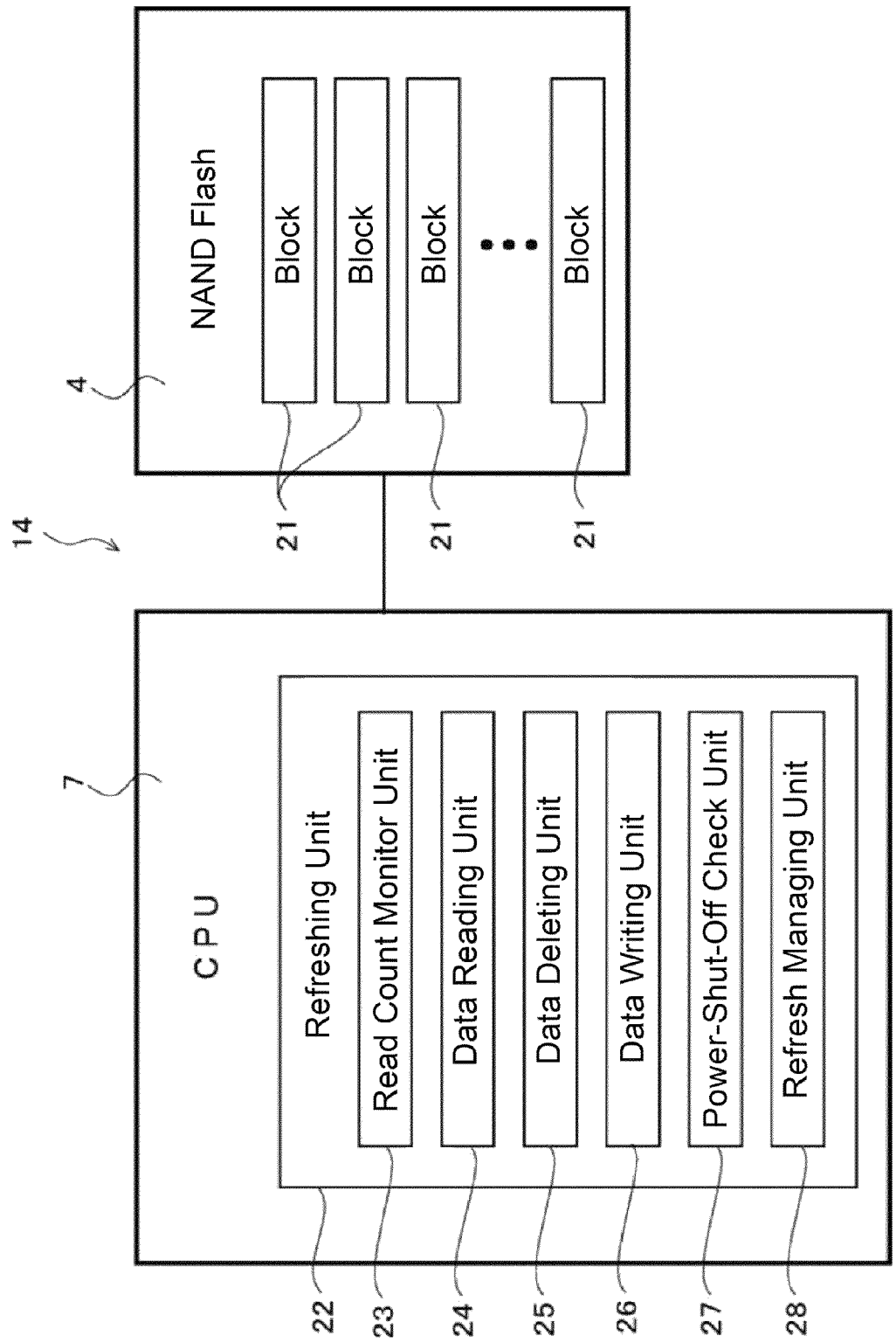
FIG. 2 illustrates a schematic diagram of a block configuration of a CPU in the image forming apparatus according to the one embodiment.

FIG. 2 illustrates a schematic diagram of a block configuration of the refresh apparatus 14 applied to the image forming apparatus 1.

The refresh apparatus 14 is, as described above, constituted of the NAND flash 4 in the main system 2 and the CPU 7 in the main control unit 5.

The NAND flash 4 is constituted of a plurality of blocks 21. Each block 21 is formed by dividing the storage region of the NAND flash 4. The block 21 has a storage capacity of, for example, 128 KB.

The NAND flash 4 of this embodiment stores the boot loader of 512 KB across several blocks, for example, four blocks from the head. That is, the NAND flash 4 stores the plurality of pieces of data of the boot loader, which is one single item of data, separately in the respective blocks 21.

The boot loader is an initiation program executed by being read at the start of the main system 2. The boot loader is read not only at the start of the usual main system 2 but also at the start of recovery from the power-saving mode. The recovery from the power-saving mode needs to be performed periodically, at every three seconds or a similar interval for, for example, monitoring to check that a network protocol has not been expired.

Therefore, the block 21, which stores the boot loader, of the NAND flash 4 is likely to generate the read disturb due to repeated reading by the specified number of times. The read disturb may be generated by reading, for example, around 300000 times. This means, if the recovery from the energy saving mode is performed at every three seconds, the read disturb occurs in a few days.

Therefore, the refresh apparatus 14 of this embodiment refreshes the block 21, which stores the boot loader, before performing the reading by the specified number of times.

By running the program in the NAND flash 4, the CPU 7 operates as a refreshing unit 22.

The refreshing unit 22 achieves a refresh function. The refreshing unit 22 sequentially refreshes the plurality of blocks 21 in units of blocks. In this embodiment, the refreshing unit 22 includes a read count monitor unit 23, a data reading unit 24, a data deleting unit 25, a data writing unit 26, a power-shut-off check unit 27, and a refresh managing unit 28.

The read count monitor unit 23 achieves a read count monitor function. The read count monitor unit 23 monitors the number of readings from the boot loader. Since the boot loader is read at the start of the main system 2, this embodiment monitors the number of starts of the main system 2. The number of starts of the main system 2 is incremented in a nonvolatile memory (not illustrated) every time the main system 2 starts. The read count monitor unit 23 monitors the number of starts in the nonvolatile memory.

The data reading unit 24 achieves a reading function. Based on monitoring by the read count monitor unit 23, if the number of starts of the main system 2 exceeds the specified number of times (threshold), the boot loader is read from the NAND flash 4.

The boot loader is read by batch-reading the data pieces of the plurality of blocks 21. The read data piece is stored in the DDR-SDRAM 6. This saves the boot loader in the NAND flash 4.

The data deleting unit 25 achieves a data deletion function. The data deleting unit 25 deletes the data piece stored in the one block (the target block) 21 of the refresh target during refresh in units of blocks.

The data writing unit 26 achieves a data writing function. During refresh in units of blocks, the data writing unit 26 reads data corresponding to the data deleted by the data deleting unit 25 from the plurality of saved data pieces and then writes the data to the target block 21. Thus, the data writing unit 26 completes the refresh in units of blocks.

All of the reading, deletion, and writing of the data piece in the NAND flash 4 can be performed via the NAND controller 8 in FIG. 1. The data piece can be stored into and read from the DDR-SDRAM 6 via the DDR-SDRAM controller 9 in FIG. 1.

The power-shut-off check unit 27 achieves a power-shut-off check function. Before starting the refresh in units of blocks, the power-shut-off check unit 27 checks whether the power supply shut off is occurring, which disables the refresh in units of blocks, or not. Whether the power shut off is occurring or not is checked based on a detection signal of a voltage input to the GPIO 12 in FIG. 1.

The power shut off in this embodiment is a power shut off (voltage drop) that disables completion of the refresh in units of blocks subsequently started from the time point. In view of this, even if the main power supply to the image forming apparatus 1 is shut off or a similar situation occurs, as long as a voltage that ensures completing the refresh in units of blocks performed immediately after the main power supply shut off is ensured in the middle of the voltage drop caused by the main power supply shut off, the power-shut-off check unit 27 determines that the power supply shut off is not occurring.

The refresh managing unit 28 achieves a refresh managing function. After completing the refresh in units of blocks, the refresh managing unit 28 causes the process to transition to the refresh in units of blocks of the subsequent block. Specifically, according to the completion of the refresh in units of blocks, if the subsequent target block 21 is not yet refreshed, the refresh managing unit 28 causes the target block 21 to be refreshed in units of blocks. This ensures sequential refresh of the plurality of blocks 21 in units of blocks.

The presence of the subsequent target block 21 not yet refreshed can be checked as follows. Information for identifying the block 21 storing the boot loader and information indicative of the completion of refresh on the block 21 are associated and stored in, for example, the NAND flash 4 and the DDR-SDRAM 6.

If the power shut off is determined not to be occurring based on the check by the power-shut-off check unit 27, the refresh managing unit 28 of this embodiment executes and instructs the refresh in units of blocks. That is, if the power shut off is occurring before the start of the refresh in units of blocks, the refresh managing unit 28 halts the refresh in units of blocks on the target block 21.

Refresh Process

Figure 3:
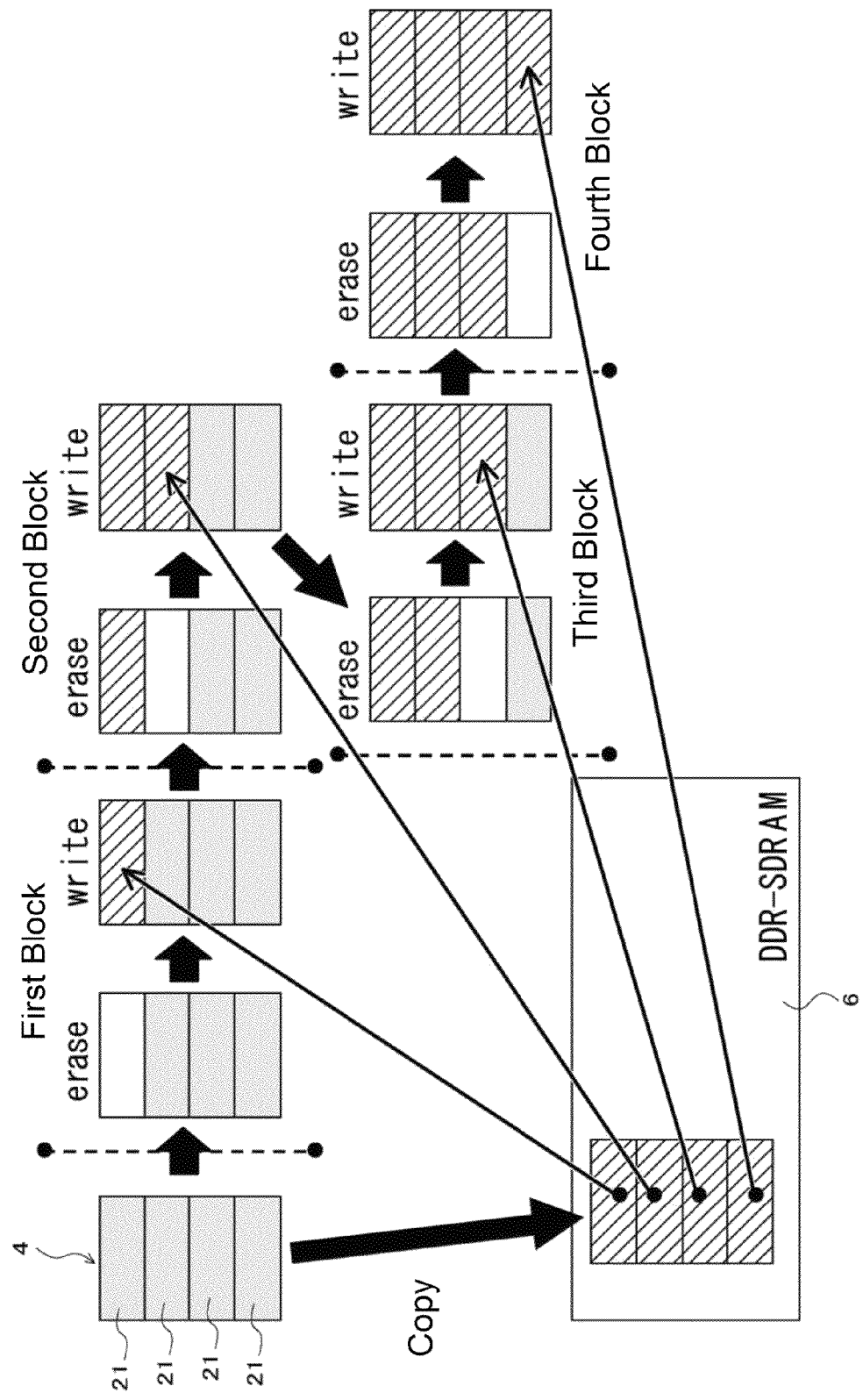
FIG. 3 illustrates a schematic diagram of a refresh process by the refresh apparatus according to the one embodiment.

FIG. 3 illustrates a schematic diagram of the refresh process by the refresh apparatus 14. The refresh process of this embodiment, as illustrated in FIG. 3, performs batch reading of the data pieces from all the four blocks 21, which store the boot loader, and copies the data pieces on the DDR-SDRAM 6. The refresh process sequentially performs the refresh in units of blocks pairing the deletion and the writing of the data pieces in the respective blocks 21 from the head block 21. Before the refresh in units of the respective blocks (dashed line in FIG. 3), whether the power supply shut off, which disables the refresh in units of blocks, is occurring or not is checked. Only when the power supply shut off is not occurring, the refresh in units of blocks is performed.

The following specifically describes the refresh in units of the respective blocks in FIG. 3. First, after confirming the no occurrence of power shut off, the refresh deletes the data pieces from the first block (head block) 21 ("erase" in FIG. 3). The refresh reads the corresponding data piece from the DDR-SDRAM 6 and writes the data piece to the first block 21 ("write" in FIG. 3).

According to the completion of the refresh in units of blocks on the last block 21, after confirming the no occurrence of the power shut off, the data pieces of the second to the fourth blocks 21 are deleted. Then, the corresponding data pieces are read from the DDR-SDRAM 6 and written.

Figure 4:
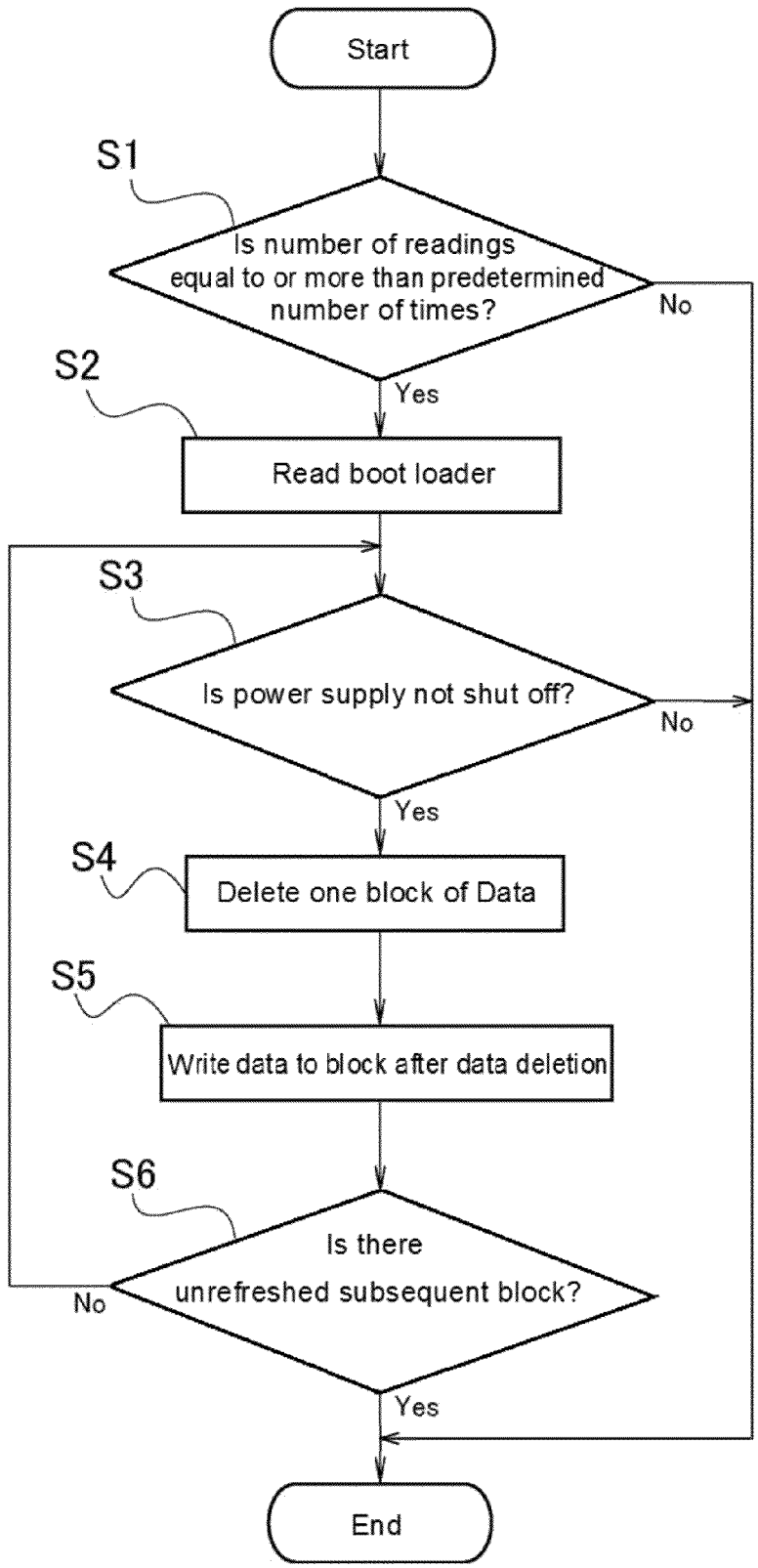
FIG. 4 is a flow chart of the refresh process by the refresh apparatus according to the one embodiment.

FIG. 4 illustrates a flow chart of the refresh process. First, at Step S1, the refresh process performs the process of "Is the number of readings equal to or more than the specified number of times?" That is, the read count monitor unit 23 determines whether the number of starts of the main system 2 stored in the nonvolatile memory (not illustrated) as the number of readings of the boot loader becomes equal to or more than the specified number of times or not.

If the number of starts becomes equal to or more than the specified number of times, the process proceeds to Step S2 (YES). If the number of starts is less than the specified number of times, the process is terminated (NO).

At Step S2, "Reading of boot loader" is performed. That is, the data reading unit 24 performs batch reading of the data pieces in the plurality of blocks 21 constituting the boot loader and stores the data pieces into the DDR-SDRAM 6 ("Copy" in FIG. 3).

Thus, after completion of Step S2, the process proceeds to Step S3.

At Steps S3 to S6, the refresh in units of blocks is sequentially performed on the plurality of blocks 21 storing the boot loader.

At Step S3, the process of "Is the power supply not shut off?" is performed. That is, before starting the refresh in units of target blocks (dashed line before refresh of every respective blocks in FIG. 3), the power-shut-off check unit 27 checks whether the power supply shut off, which disables the refresh in units of blocks, is occurring or not.

If the power supply shut off is not occurring, the process proceeds to Step S4 (YES). If the power supply shut off is occurring, the refresh managing unit 28 terminates the refresh process (NO).

At Step S4, "Data deletion of one block" is performed. That is, the refresh managing unit 28 instructs the data deleting unit 25 to execute deleting the data piece in the one target block 21, which is the refresh target. According to this, the data deleting unit 25 deletes the data piece of the boot loader stored in the target block 21 ("erase" in the refresh of every respective blocks in FIG. 3).

Thus, after completion of Step S4, the process proceeds to Step S5.

At Step S5, "Data writing to the block after data deletion" is performed. That is, the data writing unit 26 reads the data piece corresponding to the deleted data piece of the target block 21, in which where the data piece has been deleted at Step S4, from the plurality of pieces of data saved in the DDR-SDRAM 6, and then writes the data piece ("write" in the refresh in units of the respective blocks in FIG. 3) into the target block 21. Thus, the refresh in units of blocks on the target block 21 is completed.

Thus, after completion of Step S5, the process proceeds to Step S6.

At Step S6, "Is there an unrefreshed subsequent block?" is performed. That is, the refresh managing unit 28 determines whether the subsequent block storing the data piece of the boot loader that has not been yet refreshed is present or not.

When the subsequent block is present, the process returns to Step S3 and the block is caused to be refreshed in units of blocks (NO). When the subsequent block is not present, the refresh managing unit 28 causes the refresh process to be terminated (YES).

The refresh apparatus 14 according to the embodiment includes the NAND flash 4 and the refreshing unit 22. The NAND flash 4 includes the plurality of blocks 21 that store the data pieces of the boot loader. The refreshing unit 22 sequentially refreshes the plurality of blocks 21 in units of blocks. The refreshing unit 22 includes the data reading unit 24, the data deleting unit 25, and the data writing unit 26. The data reading unit 24 performs batch reading of the data pieces from the plurality of blocks 21. The data deleting unit 25 deletes the data piece stored in the target block 21 of the refresh target during the refresh in units of blocks. The data writing unit 26 writes the data piece corresponding to the deleted data piece among the plurality of read data pieces into the target block 21. The data writing unit 26 thus completes the refresh in units of blocks.

Accordingly, this embodiment ensures writing the data piece of the boot loader again to the same block 21 among the plurality of blocks 21, which store the data pieces of the boot loader, during the refresh in units of blocks. This ensures the simplified refresh process of the NAND flash 4.

This embodiment performs batch reading of the plurality of pieces of data constituting the single boot loader from the plurality of blocks 21 in the NAND flash. This embodiment sequentially performs the refresh in units of blocks pairing the deletion and re-writing of the data pieces.

Therefore, the data piece is not necessary to be read from the NAND flash 4 during the refresh in units of blocks. This ensures the simplified refresh process of the NAND flash 4 with more certainty.

Furthermore, during the refresh process, the time required for the refresh in units of the respective blocks is shortened since only the deletion and the re-writing of the data piece are performed. This ensures reducing a possibility of causing the power shut off during the refresh in units of blocks. Moreover, after the refresh in units of the respective blocks, the boot loader in the NAND flash 4 forms complete data where all the data pieces are always complete.

Accordingly, even if the refresh process is halted by the power shut off, this causes the occurrence of the power shut off between the refreshes in units of blocks only and preventing a damage of the boot loader in the NAND flash 4 due to missing of some data pieces or a similar error.

Furthermore, the time required to the refresh in units of blocks can be shortened. Accordingly, even if the power supply shut off occurs during the refresh in units of blocks, as long as the refresh in units of blocks has been completed to some extent at the time point, the refresh in units of blocks can be completed during a voltage drop caused by the power shut off.

Accordingly, this embodiment can prevent the damage of the boot loader in the NAND flash 4 with more certainty.

The refresh apparatus 14 of this embodiment includes the power-shut-off check unit 27 and the refresh managing unit 28. Before starting the refresh in units of blocks, the power-shut-off check unit 27 checks whether the power supply shut off, which disables the refresh in units of blocks, is occurring or not. If the power supply shut off is occurring, the refresh managing unit 28 halts the refresh in units of blocks.

Therefore, this embodiment can reliably cause the power shut off to occur between the refreshes in units of blocks. Further, even if the power shut off occurs in the middle of the refresh in units of blocks, the refresh in units of blocks having been completed to some extent can be reliably completed.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A refresh apparatus, comprising:
    a flash memory that includes a plurality of blocks, the plurality of blocks storing data; and
    a refreshing unit that sequentially refreshes the plurality of blocks in units of blocks, the refreshing unit including
        a reading unit that performs batch reading of data from the plurality of blocks,
        a data deleting unit that deletes data stored in a target block for the refresh during the refresh in units of blocks,
        a data writing unit that writes data corresponding to the deleted data among the plurality of read data to the target block so as to complete the refresh in units of blocks,
        a power-shut-off check unit that checks whether a power supply shut off that disables the refresh in units of blocks is occurring or not before starting the refresh in units of blocks; and
        a refresh managing unit that halts the refresh in units of blocks if the power supply shut off is determined to be occurring.

2. The refresh apparatus according to claim 1, wherein a plurality of pieces of data stored in the plurality of blocks are a plurality of pieces of data constituting one single item of data.

3. An electronic device comprising:
    a main system for an apparatus control; and
    a power-saving system that stops the main system and sets the main system in a power-saving mode, the power-saving system causing the main system to start according to a specified trigger;
    the main system including a refresh apparatus, and the refresh apparatus including
        a flash memory that includes a plurality of blocks, the plurality of blocks storing data, and
        a refreshing unit that sequentially refreshes the plurality of blocks in units of blocks, the refreshing unit including
            a reading unit that performs batch reading of data from the plurality of blocks,
            a data deleting unit that deletes data stored in a target block for the refresh during the refresh in units of blocks,
            a data writing unit that writes data corresponding to the deleted data among the plurality of read data to the target block so as to complete the refresh in units of blocks,
            a power-shut-off check unit that checks whether a power supply shut off that disables the refresh in units of blocks is occurring or not before starting the refresh in units of blocks, and
            a refresh managing unit that halts the refresh in units of blocks if the power supply shut off is determined to be occurring.

4. The electronic device according to claim 3, wherein a plurality of pieces of data stored in the plurality of blocks are a plurality of pieces of data constituting one single item of data.

5. The electronic device according to claim 4, wherein the single item of data is an initiation program to be read by the main system during the start.

6. A refresh method for a flash memory including a plurality of blocks, the plurality of blocks storing data, the method comprising:
    performing batch reading of data from the plurality of blocks;

deleting data stored in a target block for the refresh during the refresh in units of blocks;
writing data corresponding to the deleted data among the plurality of read data to the target block so as to complete the refresh in units of blocks;
sequentially refreshing the plurality of blocks in units of blocks;
checking whether a power supply shut off that disables the refresh in units of blocks is occurring or not before starting the refresh in units of blocks; and
halting the refresh in units of blocks if the power supply shut off is determined to be occurring.

7. The refresh method according to claim 6, wherein a plurality of pieces of data stored in the plurality of blocks are plurality of pieces of data constituting one single item of data.

* * * * *